(12) United States Patent
Park et al.

(10) Patent No.: US 10,738,376 B2
(45) Date of Patent: Aug. 11, 2020

(54) HARD COATING FOR CUTTING TOOL

(71) Applicant: KORLOY INC., Seoul (KR)

(72) Inventors: Je-Hun Park, Cheongju-si (KR);
Beom-Sik Kim, Cheongju-si (KR);
Seung-Su Ahn, Cheongju-si (KR);
Kyoung-il Kim, Cheongju-si (KR);
Dong-Youl Lee, Cheongju-si (KR);
Sun-Yong Ahn, Cheongju-si (KR);
Young-Heum Kim, Cheongju-si (KR)

(73) Assignee: KORLOY INC., Seoul (KR)

( * ) Notice: Subject to any disclaimer, the term of this patent is extended or adjusted under 35 U.S.C. 154(b) by 45 days.

(21) Appl. No.: 15/757,976

(22) PCT Filed: Aug. 29, 2016

(86) PCT No.: PCT/KR2016/009561
§ 371 (c)(1),
(2) Date: Mar. 7, 2018

(87) PCT Pub. No.: WO2017/047949
PCT Pub. Date: Mar. 23, 2017

(65) Prior Publication Data
US 2018/0245201 A1    Aug. 30, 2018

(30) Foreign Application Priority Data

Sep. 18, 2015  (KR) .................. 10-2015-0132111

(51) Int. Cl.
*C23C 14/06*     (2006.01)
*C23C 28/00*     (2006.01)
(Continued)

(52) U.S. Cl.
CPC .......... *C23C 14/0641* (2013.01); *C23C 14/16* (2013.01); *C23C 14/18* (2013.01);
(Continued)

(58) Field of Classification Search
USPC .................................. 428/212, 697, 698, 699
See application file for complete search history.

(56) References Cited

U.S. PATENT DOCUMENTS

| | | | |
|---|---|---|---|
| 2003/0148145 A1 | 8/2003 | Kenji et al. | |
| 2011/0033723 A1* | 2/2011 | Kim .................. | C23C 14/0021 428/553 |
| 2015/0152561 A1* | 6/2015 | Kang .................... | B32B 15/01 428/698 |

FOREIGN PATENT DOCUMENTS

| | | |
|---|---|---|
| JP | 2003-034859 A | 2/2003 |
| JP | 2003-305601 A | 10/2003 |

(Continued)

OTHER PUBLICATIONS

International Search Report for PCT/KR2016/009561 dated Dec. 6, 2016 from Korean Intellectual Property Office.

*Primary Examiner* — Archene A Turner
(74) *Attorney, Agent, or Firm* — Revolution IP, PLLC

(57) ABSTRACT

A hard coating includes a thin film layer which has a total thickness of 0.5-10 μm and has an overall composition of $Al_{1-a-b}Ti_aMe_bN$ ($0.2 < a \leq 0.6$, $0 < b \leq 0.15$), where Me is a nitride constituent element having a thermal expansion coefficient of greater than $2.7 \times 10^{-6}/°C$. and less than $9.35 \times 10^{-6}/°C$., wherein the thin film layer has a structure in which a nano-multilayered-structure of thin layers A, B and C, thin layer B being disposed between thin layer A and thin layer C, is repeatedly laminated at least once.

3 Claims, 1 Drawing Sheet

(51) Int. Cl.

| | |
|---|---|
| *C23C 28/04* | (2006.01) |
| *C23C 28/02* | (2006.01) |
| *C23C 14/32* | (2006.01) |
| *C23C 14/16* | (2006.01) |
| *C23C 14/18* | (2006.01) |
| *C23C 14/54* | (2006.01) |
| *B23B 27/14* | (2006.01) |
| *B23C 5/16* | (2006.01) |

(52) U.S. Cl.
CPC .......... *C23C 14/325* (2013.01); *C23C 14/548* (2013.01); *C23C 28/00* (2013.01); *C23C 28/02* (2013.01); *C23C 28/04* (2013.01); *B23B 27/14* (2013.01); *B23B 2228/105* (2013.01); *B23C 5/16* (2013.01); *B23C 2228/10* (2013.01)

(56) References Cited

FOREIGN PATENT DOCUMENTS

| JP | 2005-082822 A | 3/2005 |
|---|---|---|
| JP | 2005-186166 A | 7/2005 |
| JP | 2015-136752 A | 7/2015 |
| KR | 10-2013-0123238 A | 11/2013 |

\* cited by examiner

HARD COATING FOR CUTTING TOOL

TECHNICAL FIELD

The present invention relates to a hard coating for cutting tools, and more particularly, to a hard coating which includes an AlTiMeN layer constituting a nano-multilayer structure, may mitigate the occurrence of a thermal crack even though a phase decomposition occurs during a cutting process and may thereby be used suitably for medium-to-low speed interrupted cutting.

BACKGROUND ART

In order to develop a high hardness cutting tool material, various multilayer film systems based on TiN have been proposed since the late 1980's.

For example, when a multi-layered film is formed by alternately and repeatedly laminating TiN or VN with a thickness of several nanometers, despite the differences in the lattice constants of single layers, a matching interface is formed between the layers to form a so-called superlattice having one lattice constant, and thus, a high hardness of at least two times the general hardness of each single film may be achieved. A variety of attempts have been made to apply this phenomenon to a thin film for a cutting tool.

Reinforcing mechanisms used for such superlattice coating include the Koehler's model, the Hall-Petch relationship, the coherency strain model, and the like, and these reinforcing mechanisms increase hardness by controlling the differences in lattice constants and elastic moduli of materials A and B and a lamination period when the materials A and B are alternately deposited.

Recently, for example, as disclosed in Patent document 1 (Korean Patent Publication No. 2013-0123238), hard coatings for a cutting tool provided with various nano-multilayer structures, in which nitrides with various compositions such as AlTiN, TiAlN, AlTiMeN (where, Me is a metal element) are alternately laminated to achieve a remarkably improved physical property compared to a single film, have been proposed.

However, nitride thin films such as AlTiN, TiAlN, or AlTiMeN have limitations in that a phase decomposition into AlN, TiN, or MeN occurs due to a high temperature and a high pressure during a cutting process, and since the difference in thermal expansion coefficients of phase-decomposed AlN, TiN, or the like is excessively large, a thermal crack easily occurs in an initial stage during a cutting process such as medium-to-low speed interrupted milling processing and thereby reduces the tool life.

DISCLOSURE OF THE INVENTION

Technical Problem

The present invention is provided to solve the abovementioned limitations of conventional arts and the purpose of the present invention is to provide a hard coating for cutting tools, which includes a nitride layer such as AlTiN, TiAlN, or AlTiMeN and solves the limitation of the reduction of a tool life due to a thermal crack.

Technical Solution

As a means for solving the above mentioned limitation, the present invention provides a hard coating formed on the surface of a base material for a cutting tool by a PVD method, and the hard coating is characterized by including a thin film layer which has a total thickness of 0.5-10 µm and has an overall composition of $Al_{1-a-b}Ti_aMe_bN$ ($0.2<a\leq0.6$, $0<b\leq0.15$), where Me is a nitride constituent element having a thermal expansion coefficient of greater than $2.7\times10^{-6}/°C.$ and less than $9.35\times10^{-6}/°C.$, wherein the thin film layer has a structure in which a nano-multilayered-structure of thin layers A, B and C, thin layer B being disposed between thin layer A and thin layer C, is repeatedly laminated at least once, the thin film layer satisfies the relationship of kA>kB>kC, where kA is the thermal expansion coefficient of thin layer A, kB is the thermal expansion coefficient of thin layer B, and kC is the thermal expansion coefficient of thin layer C, thin layer A has a composition of $Ti_{1-a}Al_aN$ ($0.3\leq a<0.7$), thin layer B has a composition of $Ti_{1-y-z}Al_yMe_zN$ ($0.3\leq y<0.7$, $0.01\leq z<0.5$), and thin layer C has a composition of $Al_{1-x}Ti_xN$ ($0.3\leq x\leq 0.7$).

Here, the thermal expansion coefficients of thin layer A, thin layer B, and thin layer C may be values of respective inherent thermal expansion coefficients of single element nitrides times respective composition ratios.

In addition, Me may include one or more selected from among Si and Groups 4a, 5a, and 6a elements.

In addition, Me may include one or more selected from among Si, Zr, Hf, V, Ta, and Cr.

In addition, the difference in the thermal expansion coefficients of Me nitrides and the thermal expansion coefficients of the AlN and TiN may be at least $1.0\times10^{-6}/°C.$

Advantageous Effects

An AlTiMeN nitride layer included in a hard coating according to the present invention is formed in a multilayer nanostructure, and a thin layer A, a thin layer B, and a thin layer C which constitute the multilayer nanostructure is configured such that thin layer B is disposed between thin layer A and thin layer C, and the thermal expansion coefficients of thin layer B satisfies the relationship of kA>kB>KC between the thermal expansion coefficients of thin layers. Thus, even though a phase decomposition occurs during a cutting process, the occurrence of thermal cracks may be remarkably reduced, and thus, the tool life may be remarkably prolonged during a cutting process such as medium-to-low speed interrupted milling processing.

MODE FOR CARRYING OUT THE INVENTION

Hereinafter the present invention will be described in more detail on the basis of exemplary preferred example of the present invention, but the present invention is not limited to the examples below.

Figure 1:
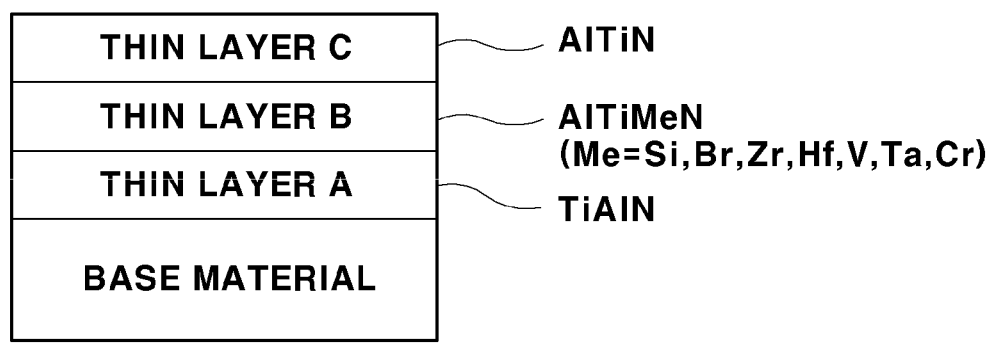
FIG. 1 is view for illustrating a nanostructure according to an embodiment of the present disclosure.

To solve the limitation of a thermal cracks due to a phase decomposition during a cutting process in a hard coating for cutting tools which includes layers of TiAlN, AlTiN, AlTiMeN, and the like, the present inventors has been carried out intensive research. As a result, the present inventors find that as illustrated in FIG. 1, a thin layer having an overall composition of $Al_{1-a-b}Ti_aMe_bN$ ($0.2<a\leq 0.6$, $0<b\leq 0.15$) is formed from a nano-multilayer structure which is formed by alternately and repeatedly laminating a structure in which an AlTiMeN layer is disposed between an AlTiN thin layer and a TiAlN thin layer, and when a nitride having a thermal expansion coefficient between those of the AlTiMeN and the AlTiN is used for the AlEiMeN layer, the occurrence of thermal cracks due to phase decomposition is remarkably reduced during a cutting process and the tool life may be prolonged. Thus, the present inventors arrive at the present invention.

A hard coating according to the present invention is formed on the surface of a base material for a cutting tool by a PVD method, and the hard coating is characterized by including a thin film layer which has a total thickness of $0.5^{-10}$ μm and has an overall composition of $Al_{1-a-b}Ti_aMe_bN$ ($0.2<a\le0.6$, $0<b\le0.15$), where Me is a nitride constituent element having a thermal expansion coefficient of greater than $2.7\times10^{-6}/°$ C. and less than $9.35\times10^{-6}/°$ C., wherein the thin film layer has a structure in which a nano-multilayered-structure of thin layers A, B and C, thin layer B being disposed between thin layer A and thin layer C, is repeatedly laminated at least once, the thin film layer satisfies the relationship of kA>kB>kC, where kA is the thermal expansion coefficient of thin layer A, kB is the thermal expansion coefficient of thin layer B, and kC is the thermal expansion coefficient of thin layer C, thin layer A has a composition of $Ti_{1-a}Al_aN$ ($0.3\le a<0.7$), thin layer B has a composition of $Ti_{1-y-z}Al_yMe_zN$ ($0.3\le y<0.7$, $0.01\le z<0.5$), and thin layer C has a composition of $Al_{1-x}Ti_xN$ ($0.3\le x<0.7$).

When the thickness of the hard coating according to the present invention is 0.5 μm or less, it is difficult to exhibit a characteristic inherent in a thin film, and when the thickness is greater than 10 μm, the thickness is favorably 0.5-10 μm, considering the fact that compressive stress accumulated in the thin film is proportional to the thickness of the thin film and a time period due to a manufacturing characteristics of the thin film formed through the PVD method.

In addition, the Me content (b) is favorably 0.15 or less because it is difficult to mitigate the difference in thermal expansion coefficient between AlTiN and TiAlN when Me is not added, and when the Me content (b) is greater than 0.15, overall wear resistance of the thin film is degraded as the hardness of MeN itself is lower than that of TiN among a phase-decomposed nitrides due to a high temperature generated during a cutting process.

In thin layer A, the Al content (a) is favorably in a range of 0.3-0.7 because when the Al content (a) is less than 0.3, Al which has a smaller atomic radius than Ti is replaced and the soluble amount of Al is reduced, hardness and wear resistance of the thin film are thereby degraded, the formation of $TiO_2$ oxide becomes easy in a high-temperature atmosphere during a cutting process and Ti elements inside the thin film is diffused to the outside, and thus, a high-temperature hardness may be degraded due to exhaustion of Ti elements, and when the Al content (a) is greater than 0.7, brittleness increases due to the formation of a phase of hexagonal B4 structure, wear resistance is thereby degraded, and the tool life may be shortened.

In thin layer B, the Al content (y) is favorably in a range of 0.3-0.7 because when the Al content (a) is less than 0.3, Al which has a smaller atomic radius than Ti is replaced and the soluble amount of Al is reduced, hardness and wear resistance of the thin film are thereby degraded, the formation of $TiO_2$ oxide becomes easy in a high-temperature atmosphere during a cutting process and Ti elements inside the thin film is diffused to the outside, and thus, a high-temperature hardness may be degraded due to exhaustion of Ti elements, and when the Al content (a) is greater than 0.7, brittleness increases due to the formation of a phase of hexagonal B4 structure, wear resistance is thereby degraded, and the tool life may be shortened.

In addition, the Me content (z) is favorably 0.01-0.5 because: when the Me content (z) is less than 0.01, a grain refining effect and a hardness increasing effect are unsatisfactory due to infiltration or substitutional solution reinforcing effect, and a merit of mitigating the difference in thermal expansion coefficient between phase-decomposed AlN and TlN is unsatisfactory because the content of phase-decomposed MeN nitrides due to a high temperature generated during a cutting process; and when the Me content (z) is greater than 0.5, as the content of MeN, which has a lower self-hardness than TiN, among the phase-decomposed nitrides by a high temperature is increased, there is a tendency of decrease in wear resistance.

Table 1 below shows thermal expansion coefficients of nitrides for each metal element.

TABLE 1

| Classification | Thermal expansion coefficient ($\times 10^{-6}$/° C.) | Hardness (GPa) |
|---|---|---|
| AlN | 2.7 | 12 |
| TiN | 9.35 | 23 |
| ZrN | 7.24 | 27 |
| HfN | 6.9 | 16.3 |
| VN | 8.7 | 14.2 |
| NbN | 10.1 | 13.3 |
| TaN | 8 | 21 |
| CrN | 3.5 | 22 |
| $Si_3N_4$ | 3.2 | 17 |

The values of the thermal expansion coefficients in Table 1 above are extracted from "handbook of refractory carbide and nitrides (by Hugh O, Pierson)".

In addition, Me is favorably a nitride-forming element such that when the Me is added to AlTiN, the thermal expansion coefficients thereof favorably fall between $2.7\times10^{-6}/°$ C. and $9.35\times10^{-6}/°$ C. which are the thermal expansion coefficients of AlN and TiN as shown in Table 1 above.

In addition, the Me is favorably a nitride-forming element which has a difference in thermal expansion coefficient of at least $1.0\times10^{-6}/°$ C. with the thermal expansion coefficient of AlTiN or TiAlN. However, since micro-structure of the nitrides formed when the Me is added is refined and the physical properties of a thin film may e improved, it is desirable that the Me be selected considering the thermal expansion coefficient when the Me is added and the degree of improving thin film characteristics due to addition of the Me.

For example, Me may include one or more selected from among Si and Groups 4a, 5a, and 6a elements. More favorably, Me may include one or more selected from among Si, Zr, Hf, V, Ta, and Cr.

Example

Figure 2:
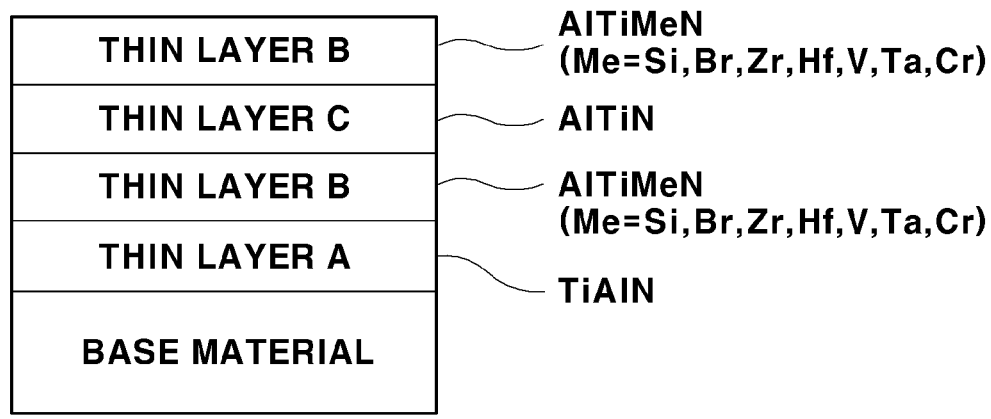
FIG. 2 is view for illustrating a nanostructure according to another embodiment of the present disclosure.

In the present invention, when an alternate repetitive lamination was performed, as shown in FIGS. 1 and 2, in which Si, Zr, Hf, V, Ta, Cr or Si was added, or V and Si were simultaneously added as the Me element included in an AlTiMeN thin film, a hard coating having a laminated nanostructure in which thin layer C was located between thin layer A and thin layer B, and for the comparison with these examples, hard coatings having a lamination structure such as the tables below according to respective comparative examples were prepared.

At this point, the substrate on which a hard coating was formed was formed by using a WC-10 wt % Co cemented carbide with a model number of APMT1604PDSR-MM.

In addition, each of nano-multilayers constituting the hard coating was formed through an arc ion plating method, which was the physical vapor deposition (PVD), so that a hard coating having cross-sectional structures illustrated in FIGS. 1 and 2 was formed.

Specifically, in examples of the present invention, arc ion plating was performed on a cemented carbide substrate formed of WC-10 wt % Co by using AlTi, TiAl, and AlTiMe arc target, and at this point, the initial vacuum pressure was $8.5 \times 10^{-5}$ Torr or less, and N2 was injected as a reaction gas. In addition, a method, in which the reaction gas pressure was set to 50 mTorr or less, the coating temperature was set to 400-500° C., and the substrate bias voltage of −20V to −150V was applied during coating, was used. The coating conditions may be set different from the examples of the present invention according to the characteristics and conditions of equipment used.

A multilayered thin film structure, in which hard coatings of laminated nanostructures were sequentially laminated in the order of TiAlN—AlTiMeN—AlTiN (an example), TiAlN—AlTiMeN—AlTiN—AlTiMeN (an example), TiAlN—AlTiN (a comparative example), TiAlN—AlTiN—TiAlN—AlTiMeN (a comparative example) through the above-mentioned coating method, was applied.

A hard coating according to an example of the present invention was completed by laminating each unit layer of the above nano-multilayers was laminated 13-20 times in a thickness of 15-20 nm such that the thickness of the hard coating film fell within a range of 2.7-3.4 μm.

Meanwhile, if necessary, thin-films with various shapes may of course be formed on the hard coating formed according to the example of the present invention. In addition, the hard coating according to the example of the present invention uses the physical vapor deposition method (PVD), and may have the maximum thin-film thickness of approximately 10 μm.

TABLE 2

Zr-containing A-B-C three-layer repetitive lamination structures

| Division | Lamination structure | Me:Zr Composition (at %) | | | | Thermal expansion coefficient ($\times 10^{-6}$/° C.) |
|---|---|---|---|---|---|---|
| | | Al | Ti | Zr | N | |
| Example 1-1 | A | 50 | 50 | 0 | | 6.025 |
| | B | 50 | 40 | 10 | | 5.814 |
| | C | 67 | 33 | 0 | | 4.8945 |
| | Theoretical composition ratio | 55.7 | 41 | 3.3 | | |
| | Analyzed value | 29.6 | 23.6 | 1.8 | 45 | |
| Example 1-2 | A | 50 | 50 | 0 | | 6.025 |
| | B | 50 | 25 | 25 | | 5.4975 |
| | C | 67 | 33 | 0 | | 4.8945 |
| | Theoretical composition ratio | 55.7 | 41 | 8.3 | | |
| | Analyzed value | 32.6 | 20.6 | 4.3 | 42.5 | |
| Example 1-3 | A | 50 | 50 | 0 | | 6.025 |
| | B | 50 | 10 | 40 | | 5.181 |
| | C | 67 | 33 | 0 | | 4.8945 |
| | Theoretical composition ratio | 55.7 | 31 | 13.3 | | |
| | Analyzed value | 30.6 | 18.1 | 7.3 | 44 | |
| Comparative example 1-6 | A | 50 | 50 | 0 | | 6.025 |
| | B | 50 | 0 | 50 | | 4.97 |
| | C | 67 | 33 | 0 | | 4.8945 |
| | Theoretical composition ratio | 55.7 | 27.7 | 16.7 | | |
| | Analyzed value | 30.7 | 15.6 | 9.5 | 44.2 | |

TABLE 3

Zr-containing A-B-C-B four-layer repetitive lamination structures

| Division | Lamination structure | Me:Zr Composition (at %) | | | | Thermal expansion coefficient ($\times 10^{-6}$/° C.) |
|---|---|---|---|---|---|---|
| | | Al | Ti | Zr | N | |
| Example 1-4 | A | 50 | 50 | 0 | | 6.025 |
| | B | 50 | 40 | 10 | | 5.814 |
| | C | 67 | 33 | 0 | | 4.8945 |
| | B | 50 | 40 | 10 | | 5.814 |
| | Theoretical composition ratio | 54.25 | 40.75 | 5 | | |
| | Analyzed value | 29.8 | 22.6 | 2.8 | 44.8 | |
| Example 1-5 | A | 50 | 50 | 0 | | 6.025 |
| | B | 50 | 25 | 25 | | 5.814 |
| | C | 67 | 33 | 0 | | 4.8945 |
| | B | 50 | 25 | 25 | | 5.4975 |
| | Theoretical composition ratio | 54.25 | 33.25 | 12.5 | | |
| | Analyzed value | 30.2 | 18.8 | 6.9 | 44.1 | |
| Comparative example 1-7 | A | 50 | 50 | 0 | | 6.025 |
| | B | 50 | 40 | 10 | | 5.181 |
| | C | 67 | 33 | 0 | | 4.8945 |
| | B | 50 | 10 | 40 | | 5.181 |
| | Theoretical composition ratio | 54.25 | 25.75 | 20 | | |
| | Analyzed value | 28.8 | 15.2 | 11 | 45 | |
| Comparative example 1-8 | A | 50 | 50 | 0 | | 6.025 |
| | B | 50 | 0 | 50 | | 4.97 |
| | C | 67 | 33 | 0 | | 4.8945 |
| | B | 50 | 0 | 50 | | 4.97 |
| | Theoretical composition ratio | 54.25 | 20.75 | 25 | | |
| | Analyzed value | 29.8 | 12.4 | 13.7 | 44.1 | |

TABLE 4

Zr-containing other lamination structures

| Division | Lamination structure | Composition (at %) Al | Ti | Zr | N | Me:Zr Thermal expansion coefficient (×10⁻⁶/° C.) |
|---|---|---|---|---|---|---|
| Comparative Example 1-1 | A | 50 | 50 | 0 | | 6.025 |
| | C | 67 | 33 | 0 | | 4.8945 |
| | A | 50 | 50 | 0 | | 6.025 |
| | B | 50 | 40 | 10 | | 5.814 |
| | Theoretical composition ratio | 54.25 | 43.25 | 2.5 | | |
| Comparative Example 1-2 | Analyzed value | 30.8 | 24.8 | 1.4 | 43 | |
| | A | 50 | 50 | 0 | | 6.025 |
| | C | 67 | 33 | 0 | | 4.8945 |
| | A | 50 | 50 | 0 | | 6.025 |
| | B | 50 | 25 | 25 | | 5.4975 |
| | Theoretical composition ratio | 54.25 | 39.5 | 6.25 | | |
| Comparative Example 1-3 | Analyzed value | 29.6 | 21.8 | 3.6 | 45 | |
| | A | 50 | 50 | 0 | | 6.025 |
| | C | 67 | 33 | 0 | | 4.8945 |
| | A | 50 | 50 | 0 | | 6.025 |
| | B | 50 | 10 | 40 | | 5.181 |
| | Theoretical composition ratio | 54.25 | 35.75 | 10 | | |
| Comparative example 1-4 | Analyzed value | 30.1 | 20.2 | 6.5 | 43.2 | |
| | A | 50 | 50 | 0 | | 6.025 |
| | C | 67 | 33 | 0 | | 4.8945 |
| | A | 50 | 50 | 0 | | 6.025 |
| | B | 50 | 0 | 50 | | 4.97 |
| | Theoretical composition ratio | 54.25 | 33.25 | 12.5 | | |
| | Analyzed value | 29.8 | 18.3 | 7.8 | 44.1 | |

TABLE 5

Comparative example containing no AlTiMeN

| Division | Lamination structure | Composition (at %) Al | Ti | Zr | N | Me:none Thermal expansion coefficient (×10⁻⁶/° C.) |
|---|---|---|---|---|---|---|
| Comparative example 5 (common) | A | 50 | 50 | 0 | | 6.025 |
| | C | 67 | 33 | 0 | | 4.8945 |
| | Theoretical composition ratio | 58.5 | 41.5 | 0 | | |
| | Analyzed value | 32.7 | 24.8 | 0 | 42.5 | |

TABLE 6

Hf-containing A-B-C three-layer repetitive lamination structures

| Division | Lamination structure | Composition (at %) Al | Ti | Hf | N | Me:Hf Thermal expansion coefficient (×10⁻⁶/° C.) |
|---|---|---|---|---|---|---|
| Example 2-1 | A | 50 | 50 | 0 | | 6.025 |
| | B | 50 | 40 | 10 | | 5.78 |
| | C | 67 | 33 | 0 | | 4.8945 |
| | Theoretical composition ratio | 55.7 | 41 | 3.3 | | |
| | Analyzed value | 32.6 | 22.8 | 2.3 | 42.3 | |
| Example 2-2 | A | 50 | 50 | 0 | | 6.025 |
| | B | 50 | 25 | 25 | | 5.78 |
| | C | 67 | 33 | 0 | | 4.8945 |
| | Theoretical composition ratio | 55.7 | 36 | 8.3 | | |
| | Analyzed value | 30.6 | 19.8 | 4.8 | 44.8 | |
| Example 2-3 | A | 50 | 50 | 0 | | 6.025 |
| | B | 50 | 10 | 40 | | 5.78 |

TABLE 6-continued

Hf-containing A-B-C three-layer repetitive lamination structures

| Division | Lamination structure | Composition (at %) Al | Ti | Me:Hf Hf | N | Thermal expansion coefficient (×10⁻⁶/° C.) |
|---|---|---|---|---|---|---|
| | C | 67 | 33 | 0 | | 4.8945 |
| | Theoretical composition ratio | 55.7 | 31 | 13.3 | | |
| | Analyzed value | 30.6 | 18.1 | 8 | 43.3 | |
| Comparative Example 2-6 | A | 50 | 50 | 0 | | 6.025 |
| | B | 50 | 0 | 50 | | 5.78 |
| | C | 67 | 33 | 0 | | 4.8945 |
| | Theoretical composition ratio | 55.7 | 27.7 | 16.7 | | |
| | Analyzed value | 31 | 15.7 | 9.2 | 44.1 | |

TABLE 7

Hf-containing A-B-C-B four-layer repetitive lamination structures

| Division | Lamination structure | Composition (at %) Al | Ti | Me:Hf Hf | N | Thermal expansion coefficient (×10⁻⁶/° C.) |
|---|---|---|---|---|---|---|
| Example 2-4 | A | 50 | 50 | 0 | | 6.025 |
| | B | 50 | 40 | 10 | | 5.78 |
| | C | 67 | 33 | 0 | | 4.8945 |
| | B | 50 | 40 | 10 | | 5.78 |

TABLE 7-continued

Hf-containing A-B-C-B four-layer repetitive lamination structures

| Division | Lamination structure | Composition (at %) Al | Ti | Me:Hf Hf | N | Thermal expansion coefficient (×10⁻⁶/° C.) |
|---|---|---|---|---|---|---|
| | Theoretical composition ratio | 54.25 | 40.75 | 5 | | |
| | Analyzed value | 30.5 | 22.6 | 2.8 | 44.1 | |
| Example 2-5 | A | 50 | 50 | 0 | | 6.025 |
| | B | 50 | 25 | 25 | | 5.78 |
| | C | 67 | 33 | 0 | | 4.8945 |
| | B | 50 | 25 | 25 | | 5.78 |
| | Theoretical composition ratio | 54.25 | 33.25 | 12.5 | | |
| | Analyzed value | 28.8 | 19.3 | 6.9 | 45 | |
| Comparative example 2-7 | A | 50 | 50 | 0 | | 6.025 |
| | B | 50 | 10 | 40 | | 5.78 |
| | C | 67 | 33 | 0 | | 4.8945 |
| | B | 50 | 10 | 40 | | 5.78 |
| | Theoretical composition ratio | 54.25 | 25.75 | 20 | | |
| | Analyzed value | 29.8 | 14.2 | 11.1 | 44.9 | |
| Comparative example 2-8 | A | 50 | 50 | 0 | | 6.025 |
| | B | 50 | 0 | 50 | | 5.78 |
| | C | 67 | 33 | 0 | | 4.8945 |
| | B | 50 | 0 | 50 | | 5.78 |
| | Theoretical composition ratio | 54.25 | 20.75 | 25 | | |
| | Analyzed value | 28.8 | 12.4 | 13.8 | 45 | |

TABLE 8

Hf-containing other lamination structures

| Division | Lamination structure | Composition (at %) Al | Ti | Me:Hf Hf | N | Thermal expansion coefficient (×10⁻⁶/° C.) |
|---|---|---|---|---|---|---|
| Comparative example 2-1 | A | 50 | 50 | 0 | | 6.025 |
| | C | 67 | 33 | 0 | | 4.8945 |
| | A | 50 | 50 | 0 | | 6.025 |
| | B | 50 | 40 | 10 | | 5.78 |
| | Theoretical composition ratio | 54.25 | 39.5 | 6.25 | | |
| | Analyzed value | 30 | 22.1 | 5.4 | 42.5 | |
| Comparative Example 2-2 | A | 50 | 50 | 0 | | 6.025 |
| | C | 67 | 33 | 0 | | 4.8945 |
| | A | 50 | 50 | 0 | | 6.025 |
| | B | 50 | 25 | 25 | | 5.4125 |
| | Theoretical composition ratio | 54.25 | 39.5 | 6.25 | | |
| | Analyzed value | 30 | 22.1 | 5.4 | 42.5 | |
| Comparative example 2-3 | A | 50 | 50 | 0 | | 6.025 |
| | C | 67 | 33 | 0 | | 4.8945 |
| | A | 50 | 50 | 0 | | 6.025 |
| | B | 50 | 10 | 40 | | 5.045 |

TABLE 8-continued

Hf-containing other lamination structures

Me:Hf

| Division | Lamination structure | Composition (at %) | | | | Thermal expansion coefficient ($\times 10^{-6}/°C$) |
|---|---|---|---|---|---|---|
| | | Al | Ti | Hf | N | |
| | Theoretical composition ratio | 54.25 | 35.75 | 10 | | |
| | Analyzed value | 29.8 | 19.5 | 5.7 | 45 | |
| Comparative example 2-4 | A | 50 | 50 | 0 | | 6.025 |
| | C | 67 | 33 | 0 | | 4.8945 |
| | A | 50 | 50 | 0 | | 6.025 |
| | B | 50 | 0 | 50 | | 4.8 |
| | Theoretical composition ratio | 54.25 | 33.25 | 12.5 | | |
| | Analyzed value | 29.6 | 18.3 | 6.9 | 45.2 | |

TABLE 9

V-containing A-B-C three-layer repetitive lamination structures

Me:V

| Division | Lamination structure | Composition (at %) | | | | Thermal expansion coefficient ($\times 10^{-6}/°C$) |
|---|---|---|---|---|---|---|
| | | Al | Ti | V | N | |
| Example 3-1 | A | 50 | 50 | 0 | | 6.025 |
| | B | 50 | 40 | 10 | | 5.96 |
| | C | 67 | 33 | 0 | | 4.8945 |
| | Theoretical composition ratio | 55.7 | 41 | 3.3 | | |
| | Analyzed value | 30.5 | 23.6 | 1.9 | 44 | |
| Example 3-2 | A | 50 | 50 | 0 | | 6.025 |
| | B | 50 | 25 | 25 | | 5.8625 |
| | C | 67 | 33 | 0 | | 4.8945 |
| | Theoretical composition ratio | 55.7 | 36 | 8.3 | | |
| | Analyzed value | 30.6 | 19.8 | 4.8 | 44.8 | |
| Comparative example 3-7 | A | 50 | 50 | 0 | | 6.025 |
| | B | 50 | 0 | 50 | | 5.7 |
| | C | 67 | 33 | 0 | | 4.8945 |
| | Theoretical composition ratio | 55.7 | 27.7 | 16.7 | | |
| | Analyzed value | 30.6 | 16.4 | 9.2 | 43.8 | |
| Comparative example 3-8 | A | 50 | 50 | 0 | | 6.025 |
| | B | 10 | 50 | 40 | | 8.425 |
| | C | 67 | 33 | 0 | | 4.8945 |
| | Theoretical composition ratio | 42.3 | 44.3 | 13.3 | | |
| | Analyzed value | 23.3 | 25.4 | 7.3 | 44 | |

TABLE 10

V-containing A-B-C-B four-layer repetitive lamination structures

Me:V

| Division | Lamination structure | Composition (at %) | | | | Thermal expansion coefficient ($\times 10^{-6}/°C$) |
|---|---|---|---|---|---|---|
| | | Al | Ti | V | N | |
| Example 3-4 | A | 50 | 50 | 0 | | 6.025 |
| | B | 50 | 40 | 10 | | 5.96 |
| | C | 67 | 33 | 0 | | 4.8945 |
| | B | 50 | 40 | 10 | | 5.96 |
| | Theoretical composition ratio | 54.25 | 40.75 | 5 | | |
| | Analyzed value | 29.8 | 22.3 | 2.9 | 44.9 | |
| Example 3-5 | A | 50 | 50 | 0 | | 6.025 |
| | B | 50 | 25 | 25 | | 5.8625 |
| | C | 67 | 33 | 0 | | 4.8945 |
| | B | 50 | 25 | 25 | | 5.8625 |
| | Theoretical composition ratio | 54.25 | 33.25 | 12.5 | | |
| | Analyzed value | 30 | 18.5 | 6.9 | 44.6 | |
| Comparative example 3-11 | A | 50 | 50 | 0 | | 6.025 |
| | B | 50 | 10 | 40 | | 5.8625 |
| | C | 67 | 33 | 0 | | 4.8945 |
| | B | 50 | 10 | 40 | | 5.8625 |
| | Theoretical composition ratio | 54.25 | 25.75 | 20 | | |
| | Analyzed value | 29.8 | 14.2 | 12.3 | 43.7 | |
| Comparative example 3-12 | A | 50 | 50 | 0 | | 6.025 |
| | B | 50 | 0 | 50 | | 5.7 |
| | C | 67 | 33 | 0 | | 4.8945 |
| | B | 50 | 0 | 50 | 5.7 | |
| | Theoretical composition ratio | 54.25 | 20.75 | 25 | | |
| | Analyzed value | 28.1 | 13.2 | 13.8 | 44.9 | |

TABLE 10-continued

V-containing A-B-C-B four-layer repetitive lamination structures

| Division | Lamination structure | Composition (at %) Al | Ti | V | Me:V N | Thermal expansion coefficient (×10$^{-6}$/° C.) |
|---|---|---|---|---|---|---|
| Comparative example 3-13 | A | 50 | 50 | 0 | | 6.025 |
| | B | 10 | 50 | 40 | | 8.425 |
| | C | 67 | 33 | 0 | | 4.8945 |
| | B | 10 | 50 | 40 | | 8.425 |
| | Theoretical composition ratio | 34.25 | 45.75 | 20 | | |
| | Analyzed value | 19 | 25.2 | 11 | 44.8 | |

TABLE 11

V-containing other lamination structures

| Division | Lamination structure | Composition (at %) Al | Ti | V | Me:V N | Thermal expansion coefficient (×10$^{-6}$/° C.) |
|---|---|---|---|---|---|---|
| Comparative example 3-1 | A | 50 | 50 | 0 | | 6.025 |
| | C | 67 | 33 | 0 | | 4.8945 |
| | A | 50 | 50 | 0 | | 6.025 |
| | B | 50 | 40 | 10 | | 5.96 |
| | Theoretical composition ratio | 54.25 | 43.25 | 2.5 | | |
| | Analyzed value | 29.8 | 23.8 | 1.4 | 45 | |
| Comparative Example 3-2 | A | 50 | 50 | 0 | | 6.025 |
| | C | 67 | 33 | 0 | | 4.8945 |
| | A | 50 | 50 | 0 | | 6.025 |
| | B | 50 | 25 | 25 | | 5.8625 |
| | Theoretical composition ratio | 54.25 | 39.5 | 6.25 | | |
| | Analyzed value | 29.9 | 21.7 | 3.4 | 44.9 | |
| Comparative example 3-3 | A | 50 | 50 | 0 | | 6.025 |
| | C | 67 | 33 | 0 | | 4.8945 |
| | A | 50 | 50 | 0 | | 6.025 |
| | B | 50 | 10 | 40 | | 5.765 |
| | Theoretical composition ratio | 54.25 | 35.75 | 10 | | |
| | Analyzed value | 30.3 | 20.7 | 6.5 | 42.5 | |
| Comparative example 3-4 | A | 50 | 50 | 0 | | 6.025 |
| | C | 67 | 33 | 0 | | 4.8945 |
| | A | 50 | 50 | 0 | | 6.025 |
| | B | 50 | 0 | 50 | | 5.7 |
| | Theoretical composition ratio | 54.25 | 33.25 | 12.5 | | |
| | Analyzed value | 26.8 | 21.3 | 8.2 | 43.7 | |
| Comparative example 3-5 | | 50 | 50 | 0 | | 6.025 |
| | | 67 | 33 | 0 | | 4.8945 |
| | | 50 | 50 | 0 | | 6.025 |
| | | 10 | 50 | 40 | | 8.425 |
| | | 44.25 | 45.75 | 10 | | |
| | | 24.3 | 25.2 | 6 | 44.5 | |

TABLE 12

Nb-containing A-B-C three-layer repetitive lamination structures

| Division | Lamination structure | Composition (at %) Al | Ti | Me:Nb Nb | N | Thermal expansion coefficient (×10$^{-6}$/° C.) |
|---|---|---|---|---|---|---|
| Comparative Example 4-1 | A | 50 | 50 | 0 | | 6.025 |
| | B | 50 | 40 | 10 | | 6.1 |
| | C | 67 | 33 | 0 | | 4.8945 |
| | Theoretical composition ratio | 55.7 | 41 | 3.3 | | |
| | Analyzed value | 31.1 | 22.6 | 1.8 | 44.5 | |
| Comparative Example 4-2 | A | 50 | 50 | 0 | | 6.025 |
| | B | 50 | 25 | 25 | | 6.2125 |
| | C | 67 | 33 | 0 | | 4.8945 |
| | Theoretical composition ratio | 55.7 | 36 | 8.3 | | |
| | Analyzed value | 30.6 | 19.8 | 4.7 | 44.9 | |
| Comparative Example 4-3 | A | 50 | 50 | 0 | | 6.025 |
| | B | 50 | 10 | 40 | | 6.325 |
| | C | 67 | 33 | 0 | | 4.8945 |
| | Theoretical composition ratio | 55.7 | 31 | 13.3 | | |
| | Analyzed value | 30.6 | 17.1 | 7.6 | 44.7 | |
| Comparative example 4-4 | A | 50 | 50 | 0 | | 6.025 |
| | B | 50 | 0 | 50 | | 6.4 |
| | C | 67 | 33 | 0 | | 4.8945 |
| | Theoretical composition ratio | 55.7 | 27.7 | 16.7 | | |
| | Analyzed value | 30.1 | 15.2 | 9.2 | 45.5 | |

TABLE 13

Nb-containing A-B-C-B four-layer repetitive lamination structures

| Division | Lamination structure | Composition (at %) Al | Ti | Me:Nb Nb | N | Thermal expansion coefficient (×10$^{-6}$/° C.) |
|---|---|---|---|---|---|---|
| Comparative example 4-5 | A | 50 | 50 | 0 | | 6.025 |
| | B | 50 | 40 | 10 | | 6.1 |
| | C | 67 | 33 | 0 | | 4.8945 |
| | B | 50 | 40 | 10 | | 6.1 |
| | Theoretical composition ratio | 54.25 | 40.75 | 5 | | |
| | Analyzed value | 29.8 | 22.4 | 2.8 | 45 | |
| Comparative example 4-6 | A | 50 | 50 | 0 | | 6.025 |
| | B | 50 | 25 | 25 | | 6.2125 |
| | C | 67 | 33 | 0 | | 4.8945 |
| | B | 50 | 25 | 25 | | 6.2125 |
| | Theoretical composition ratio | 54.25 | 33.25 | 12.5 | | |
| | Analyzed value | 29.8 | 20.3 | 6.9 | 42.5 | |
| Comparative example 4-7 | A | 50 | 50 | 0 | | 6.025 |
| | B | 50 | 10 | 40 | | 6.325 |
| | C | 67 | 33 | 0 | | 4.8945 |
| | B | 50 | 10 | 40 | | 6.325 |
| | Theoretical composition ratio | 54.25 | 25.75 | 20 | | |
| | Analyzed value | 29.8 | 15.2 | 12.5 | 41.5 | |
| Comparative example 4-8 | A | 50 | 50 | 0 | | 6.025 |
| | B | 50 | 0 | 50 | | 6.4 |
| | C | 67 | 33 | 0 | | 4.8945 |
| | B | 50 | 0 | 50 | | 6.4 |
| | Theoretical composition ratio | 54.25 | 20.75 | 25 | | |
| | Analyzed value | 29.8 | 11.4 | 13.8 | 45 | |

TABLE 14

Ta-containing A-B-C three-layer repetitive lamination structures

| Division | Lamination structure | Composition (at %) Al | Ti | Me:Ta Ta | N | Thermal expansion coefficient (×10$^{-6}$/° C.) |
|---|---|---|---|---|---|---|
| Example 5-1 | A | 50 | 50 | 0 | | 6.025 |
| | B | 50 | 40 | 10 | | 5.89 |
| | C | 67 | 33 | 0 | | 4.8945 |
| | Theoretical composition ratio | 55.7 | 41 | 3.3 | | |
| | Analyzed value | 30.4 | 22.6 | 1.8 | 45.2 | |
| Example 5-2 | A | 50 | 50 | 0 | | 6.025 |
| | B | 50 | 25 | 25 | | 5.6875 |
| | C | 67 | 33 | 0 | | 4.8945 |
| | Theoretical composition ratio | 55.7 | 36 | 8.3 | | |
| | Analyzed value | 30.6 | 19.8 | 4.9 | 44.7 | |
| Example 5-3 | A | 50 | 50 | 0 | | 6.025 |
| | B | 50 | 10 | 40 | | 5.485 |
| | C | 67 | 33 | 0 | | 4.8945 |
| | Theoretical composition ratio | 55.7 | 31 | 13.3 | | |
| | Analyzed value | 30.4 | 17.1 | 7.5 | 45 | |
| Comparative example 5-6 | A | 50 | 50 | 0 | | 6.025 |
| | B | 50 | 0 | 50 | | 5.35 |
| | C | 67 | 33 | 0 | | 4.8945 |
| | Theoretical composition ratio | 55.7 | 27.7 | 16.7 | | |
| | Analyzed value | 31.6 | 15.2 | 10.2 | 43 | |

TABLE 15

Ta-containing A-B-C-B four-layer repetitive lamination structures

| Division | Lamination structure | Composition (at %) Al | Ti | Me:Ta Ta | N | Thermal expansion coefficient (×10⁻⁶/°C.) |
|---|---|---|---|---|---|---|
| example 5-4 | A | 50 | 50 | 0 | | 6.025 |
| | B | 50 | 40 | 10 | | 5.89 |
| | C | 67 | 33 | 0 | | 4.8945 |
| | B | 50 | 40 | 10 | | 5.89 |
| | Theoretical composition ratio | 54.25 | 40.75 | 5 | | |
| | Analyzed value | 29.7 | 22.4 | 2.8 | 45.1 | |
| example 5-5 | A | 50 | 50 | 0 | | 6.025 |
| | B | 50 | 25 | 25 | | 5.6875 |
| | C | 67 | 33 | 0 | | 4.8945 |
| | B | 50 | 25 | 25 | | 5.6875 |
| | Theoretical composition ratio | 54.25 | 33.25 | 12.5 | | |
| | Analyzed value | 29.8 | 18.6 | 7 | 44.6 | |
| Comparative example 5-7 | A | 50 | 50 | 0 | | 6.025 |
| | B | 50 | 10 | 40 | | 5.485 |
| | C | 67 | 33 | 0 | | 4.8945 |
| | B | 50 | 10 | 40 | | 5.485 |
| | Theoretical composition ratio | 54.25 | 25.75 | 20 | | |
| | Analyzed value | 29.8 | 14.2 | 11.2 | 44.8 | |
| Comparative example 5-8 | A | 50 | 50 | 0 | | 6.025 |
| | B | 50 | 0 | 50 | | 5.35 |
| | C | 67 | 33 | 0 | | 4.8945 |
| | B | 50 | 0 | 50 | | 5.35 |
| | Theoretical composition ratio | 54.25 | 20.75 | 25 | | |
| | Analyzed value | 29.8 | 11.4 | 13.8 | 45 | |

TABLE 16

Ta-containing other lamination structures

| Division | Lamination structure | Composition (at %) Al | Ti | Me:Ta Ta | N | Thermal expansion coefficient (×10⁻⁶/°C.) |
|---|---|---|---|---|---|---|
| Comparative example 5-1 | A | 50 | 50 | 0 | | 6.025 |
| | C | 67 | 33 | 0 | | 4.8945 |
| | A | 50 | 50 | 0 | | 6.025 |
| | B | 50 | 40 | 10 | | 5.89 |
| | Theoretical composition ratio | 54.25 | 43.25 | 2.5 | | |
| | Analyzed value | 29.6 | 23.8 | 1.4 | 45.2 | |
| Comparative Example 5-2 | A | 50 | 50 | 0 | | 6.025 |
| | C | 67 | 33 | 0 | | 4.8945 |
| | A | 50 | 50 | 0 | | 6.025 |
| | B | 50 | 25 | 25 | | 5.6875 |
| | Theoretical composition ratio | 54.25 | 39.5 | 6.25 | 0 | |
| | Analyzed value | 29.9 | 22 | 3.4 | 44.7 | |
| Comparative example 5-3 | A | 50 | 50 | 0 | | 6.025 |
| | C | 67 | 33 | 0 | | 4.8945 |
| | A | 50 | 50 | 0 | | 6.025 |
| | B | 50 | 10 | 40 | | 5.485 |
| | Theoretical composition ratio | 54.25 | 35.75 | 10 | | |
| | Analyzed value | 29.8 | 19.7 | 5.5 | 45 | |
| Comparative example 5-4 | A | 50 | 50 | 0 | | 6.025 |
| | C | 67 | 33 | 0 | | 4.8945 |
| | A | 50 | 50 | 0 | | 6.025 |
| | B | 50 | 0 | 50 | | 5.35 |

TABLE 16-continued

Ta-containing other lamination structures

| Division | Lamination structure | Me:Ta Composition (at %) Al | Ti | Ta | N | Thermal expansion coefficient (×10⁻⁶/° C.) |
|---|---|---|---|---|---|---|
| | Theoretical composition ratio | 54.25 | 33.25 | 12.5 | | |
| | Analyzed value | 29.8 | 20.3 | 7.1 | 42.8 | |

TABLE 17

Cr-containing A-B-C three-layer repetitive lamination structures

| Division | Lamination structure | Me:Cr Composition (at %) Al | Ti | Cr | N | Thermal expansion coefficient (×10⁻⁶/° C.) |
|---|---|---|---|---|---|---|
| Example 6-1 | A | 50 | 50 | 0 | | 6.025 |
| | B | 50 | 40 | 10 | | 5.44 |
| | C | 67 | 33 | 0 | | 4.8945 |
| | Theoretical composition ratio | 55.7 | 41 | 3.3 | | |
| | Analyzed value | 30.8 | 22.6 | 1.8 | 44.8 | |
| Example 6-2 | A | 50 | 50 | 0 | | 6.025 |
| | B | 40 | 35 | 25 | | 5.2275 |
| | C | 67 | 33 | 0 | | 4.8945 |
| | Theoretical composition ratio | 52.3 | 39.3 | 8.3 | | |
| | Analyzed value | 29.3 | 21.6 | 4.6 | 44.5 | |
| Example 6-3 | A | 50 | 50 | 0 | | 6.025 |
| | B | 25 | 35 | 40 | | 5.3475 |
| | C | 67 | 33 | 0 | | 4.8945 |
| | Theoretical composition ratio | 47.3 | 39.3 | 13.3 | | |
| | Analyzed value | 26 | 21.6 | 8.8 | 43.5 | |
| Comparative example 6-1 | A | 50 | 50 | 0 | | 6.025 |
| | B | 15 | 35 | 50 | | 5.4275 |
| | C | 67 | 33 | 0 | | 4.8945 |
| | Theoretical composition ratio | 44 | 39.3 | 16.7 | | |
| | Analyzed value | 24.4 | 21.6 | 9.2 | 44.8 | |
| Comparative example 6-2 | A | 50 | 50 | 0 | | 6.025 |
| | B | 50 | 25 | 25 | | 4.5625 |
| | C | 67 | 33 | 0 | | 4.8945 |
| | Theoretical composition ratio | 55.7 | 36 | 8.3 | | |
| | Analyzed value | 30.6 | 19.8 | 5.6 | 44 | |

TABLE 18

Cr-containing A-B-C-B four-layer repetitive lamination structures

| Division | Lamination structure | Me:Cr Composition (at %) Al | Ti | Cr | N | Thermal expansion coefficient (×10⁻⁶/° C.) |
|---|---|---|---|---|---|---|
| Example 6-4 | A | 50 | 50 | 0 | | 6.025 |
| | B | 50 | 40 | 10 | | 5.44 |
| | C | 67 | 33 | 0 | | 4.8945 |
| | B | 50 | 40 | 10 | | 5.44 |
| | Theoretical composition ratio | 54.25 | 40.75 | 5 | | |
| | Analyzed value | 31.4 | 22.4 | 2.8 | 43.4 | |
| Example 6-5 | A | 50 | 50 | 0 | | 6.025 |
| | B | 40 | 35 | 25 | | 5.2275 |
| | C | 67 | 33 | 0 | | 4.8945 |
| | B | 40 | 35 | 25 | | 5.2275 |
| | Theoretical composition ratio | 49.25 | 38.25 | 12.5 | | |
| | Analyzed value | 27.1 | 21.4 | 6.5 | 45 | |
| Comparative example 6-3 | A | 50 | 50 | 0 | | 6.025 |
| | B | 25 | 35 | 40 | | 5.3475 |
| | C | 67 | 33 | 0 | | 4.8945 |
| | B | 25 | 35 | 40 | | 5.3475 |
| | Theoretical composition ratio | 41.75 | 38.25 | 20 | | |
| | Analyzed value | 23 | 21.7 | 11.2 | 44.1 | |
| Comparative example 6-4 | A | 50 | 50 | 0 | | 6.025 |
| | B | 15 | 35 | 50 | | 5.4275 |
| | C | 67 | 33 | 0 | | 4.8945 |
| | B | 15 | 35 | 50 | | 5.4275 |
| | Theoretical composition ratio | 36.75 | 38.25 | 25 | | |
| | Analyzed value | 20.2 | 21.3 | 13.8 | 44.7 | |
| Comparative example 6-5 | A | 50 | 50 | 0 | | 6.025 |
| | B | 50 | 25 | 25 | | 4.5625 |
| | C | 67 | 33 | 0 | | 4.8945 |
| | B | 50 | 25 | 25 | | 4.5625 |
| | Theoretical composition ratio | 54.25 | 33.25 | 12.5 | 0 | |
| | Analyzed value | 28.8 | 21.6 | 7.1 | 42.5 | |

TABLE 19

Si-containing A-B-C three-layer repetitive lamination structures

| Division | Lamination structure | Composition (at %) Al | Ti | Si | N | Thermal expansion coefficient (×10⁻⁶/° C.) |
|---|---|---|---|---|---|---|
| Example 7-1 | A | 50 | 50 | 0 | | 6.025 |
| | B | 50 | 40 | 10 | | 5.41 |
| | C | 67 | 33 | 0 | | 4.8945 |
| | Theoretical composition ratio | 55.7 | 41 | 3.3 | | |
| | Analyzed value | 30.8 | 22.6 | 1.7 | 45.1 | |
| Example 7-2 | A | 50 | 50 | 0 | | 6.025 |
| | B | 40 | 35 | 25 | | 5.1525 |
| | C | 67 | 33 | 0 | | 4.8945 |
| | Theoretical composition ratio | 52.3 | 39.3 | 8.3 | | |
| | Analyzed value | 28.9 | 22.1 | 4.1 | 44.9 | |
| Example 7-3 | A | 50 | 50 | 0 | | 6.025 |
| | B | 25 | 35 | 40 | | 5.2275 |
| | C | 67 | 33 | 0 | | 4.8945 |
| | Theoretical composition ratio | 47.3 | 39.3 | 13.3 | | |
| | Analyzed value | 26 | 23 | 6.9 | 44.1 | |

TABLE 20

Si-containing A-B-C-B four-layer repetitive lamination structures

| Division | Lamination structure | Composition (at %) Al | Ti | Si | N | Thermal expansion coefficient (×10⁻⁶/° C.) |
|---|---|---|---|---|---|---|
| Example 7-4 | A | 50 | 50 | 0 | | 6.025 |
| | B | 50 | 40 | 10 | | 5.41 |
| | C | 67 | 33 | 0 | | 4.8945 |
| | B | 50 | 40 | 10 | | 5.41 |
| | Theoretical composition ratio | 54.25 | 40.75 | 5 | | |
| | Analyzed value | 30.9 | 22.5 | 2.3 | 44.3 | |
| Example 7-5 | A | 50 | 50 | 0 | | 6.025 |
| | B | 40 | 35 | 25 | | 5.1525 |
| | C | 67 | 33 | 0 | | 4.8945 |
| | B | 40 | 35 | 25 | | 5.1525 |
| | Theoretical composition ratio | 49.25 | 38.25 | 12.5 | | |
| | Analyzed value | 27.1 | 21 | 6.7 | 45.2 | |
| Comparative example 7-1 | A | 50 | 50 | 0 | | 6.025 |
| | B | 25 | 35 | 40 | | 5.2275 |
| | C | 67 | 33 | 0 | | 4.8945 |
| | B | 25 | 35 | 40 | | 5.2275 |
| | Theoretical composition ratio | 41.75 | 38.25 | 20 | | |
| | Analyzed value | 24.1 | 21 | 10.4 | 44.5 | |

TABLE 21

V and Si-containing lamination Structures

| Division | Lamination structure | Composition (at %) Al | Ti | V | Si | N | Thermal expansion coefficient (×10⁻⁶/° C.) |
|---|---|---|---|---|---|---|---|
| Example 8-1 | A | 50 | 50 | 0 | 0 | | 6.025 |
| | B | 50 | 40 | 10 | 0 | | 5.96 |
| | C | 67 | 33 | 0 | 0 | | 4.8945 |
| | D | 50 | 40 | 0 | 10 | | 5.41 |
| | Theoretical composition ratio | 54.3 | 40.8 | 2.5 | 2.5 | | |
| | Analyzed value | 29.8 | 22.4 | 1.4 | 1.4 | 45.0 | |
| Example 8-2 | A | 50 | 50 | 0 | 0 | | 6.025 |
| | B | 50 | 35 | 10 | 5 | | 5.6525 |
| | C | 67 | 33 | 0 | 0 | | 4.8945 |
| | Theoretical composition ratio | 55.7 | 39.3 | 3.3 | 1.7 | | |
| | Analyzed value | 30.4 | 21.6 | 1.8 | 1.0 | 45.1 | |

Cutting Performance Test Results

With respect to the hard coatings formed as described above, a heat-resistance crack test, a milling wear resistance test, and a milling shock resistance test were performed and the cutting performance was evaluated.

At his point, the used I/S model number was APMT1604PDSR-MM and the used cutter model number was AMC3063HS.

(1) Heat Resistance Evaluation Conditions

Workpiece to be cut: STS316 (100×200×300)

Cutting speed: 120 m/min

Feed per tooth: 0.25 mm/tooth

Depth of cut: 10 mm

Radial depth of cut: 5 mm

Dry-type is applied, and states of tool noses are compared in batch after processing 780 cm.

(2) Milling Wear Resistance Characteristic Evaluation Conditions

Workpiece to be cut: SCM440 (100×200×300)

Cutting speed: 250 m/min

Feed per tooth: 0.1 mm/tooth

Depth of cut: 10 mm

Radial depth of cut: 5 mm

Dry type is applied.

(3) Milling Shock Resistance Characteristic Evaluation Conditions

Workpiece to be cut: SCM440 3-line diaphragm plate (100×30×300)

Cutting speed: 180 m/min

Feed per tooth: 0.15 mm/tooth

Depth of cut: 10 mm

Radial depth of cut: 5 mm

Dry type is applied.

The above cutting performance test results are arranged in tables below.

TABLE 22

Zr-containing thin film test results

| *Containing Zr Division | Thin film thickness (μm) | Thin film hardness (GPa) | Number of thermal cracks | Milling wear resistance (cm) | | Milling shock resistance (cm) | |
|---|---|---|---|---|---|---|---|
| Comparative Example 1-1 | 3.0 | 38 | 5 | 2400 | Normal wear | 400 | Chipping |
| Comparative Example 1-2 | 2.9 | 38 | 6 | 2400 | Normal wear | 400 | Chipping |
| Comparative Example 1-3 | 3.0 | 38.5 | 6 | 1650 | Chipping wear | 400 | Chipping |
| Comparative Example 1-4 | 3.2 | 37.8 | 6 | 2400 | Normal wear | 400 | Chipping |
| Comparative Example 5 (common) | 3.4 | 33.1 | 8 | 1600 | Chipping | 310 | Chipping |
| Comparative Example 6 | 3.1 | 37.5 | 5 | 2100 | Normal wear | 400 | Chipping |
| Comparative Example 7 | 3.4 | 36.2 | 0 | 1800 | Normal wear | 50 | Chipping |
| Comparative Example 8 | 3.2 | 36.9 | 0 | 1400 | Initial delamination | 50 | Initial delamination |
| Example 1-1 | 3.1 | 37.5 | 1 | 2400 | Normal wear | 800 | Chipping |
| Example 1-2 | 2.9 | 37.7 | 0 | 2100 | Normal wear | 800 | Chipping |
| Example 1-3 | 2.8 | 37.9 | 0 | 2100 | Normal wear | 750 | Chipping |
| Example 1-4 | 2.8 | 42 | 0 | 2400 | Normal wear | 780 | Chipping |
| Example 1-5 | 2.7 | 41.5 | 0 | 2400 | Normal wear | 700 | Chipping |

TABLE 23

Hf-containing thin film test results

| *Containing Hf Division | Thin film thickness (μm) | Thin film hardness (GPa) | Number of thermal cracks | Milling wear resistance (cm) | | Milling shock resistance (cm) | |
|---|---|---|---|---|---|---|---|
| Comparative Example 2-1 | 3.3 | 36 | 5 | 2100 | Normal wear | 400 | Chipping |
| Comparative Example 2-2 | 3.3 | 36.2 | 4 | 2100 | Normal wear | 400 | Chipping |
| Comparative Example 2-3 | 3.3 | 36.2 | 3 | 2200 | Normal wear | 400 | Chipping |
| Comparative Example 2-4 | 3.1 | 36.2 | 5 | 2200 | Normal wear | 400 | Chipping |
| Comparative Example 2-6 (common) | 3.2 | 35.8 | 0 | 1980 | Normal wear | 310 | Chipping |
| Comparative Example 2-7 | 3.1 | 35.5 | 1 | 250 | Initial delamination | 400 | Chipping |
| Comparative Example 2-8 | 2.9 | 36 | 0 | 100 | Initial delamination | 50 | Chipping |
| Example 2-1 | 3.0 | 35.5 | 1 | 2200 | Normal wear | 800 | Chipping |
| Example 2-2 | 2.9 | 35.8 | 1 | 2200 | Normal wear | 800 | Chipping |
| Example 2-3 | 2.9 | 36.1 | 1 | 2200 | Normal wear | 750 | Chipping |
| Example 2-4 | 3.0 | 38 | 0 | 2300 | Normal wear | 780 | Chipping |
| Example 2-5 | 2.9 | 38.1 | 0 | 2300 | Normal wear | 700 | Chipping |

TABLE 24

V-containing thin film test results

| *Containing V Division | Thin film thickness (μm) | Thin film hardness (GPa) | Number of thermal cracks | Milling wear resistance (cm) | | Milling shock resistance (cm) | |
|---|---|---|---|---|---|---|---|
| | | | | | Cutting performance evaluation results | | |
| Comparative Example 3-1 | 3.0 | 36 | 4 | 2200 | Normal wear | 650 | Chipping |
| Comparative Example 3-2 | 2.9 | 36.1 | 6 | 2200 | Normal wear | 650 | Chipping |
| Comparative Example 3-4 | 3.3 | 36.2 | 5 | 2100 | Normal wear | 450 | Chipping |
| Comparative Example 3-5 | 3.1 | 37 | 6 | 2100 | Normal wear | 650 | Chipping |
| Comparative Example 3-7 | 3.1 | 32.1 | 5 | 2100 | Normal wear | 600 | Chipping |
| Comparative Example 3-8 | 3.1 | 36.2 | 7 | 2000 | Normal wear | 600 | Chipping |
| Comparative Example 3-11 | 3.1 | 32 | 5 | 1200 | Initial delamination | 250 | Chipping |
| Comparative Example 3-12 | 3.1 | 30.8 | 5 | 800 | Chipping | 480 | Chipping |
| Comparative Example 3-13 | 3.1 | 32.5 | 8 | 800 | Chipping | 400 | Chipping |
| Example 3-1 | 3.0 | 35.5 | 0 | 2200 | Normal wear | 900 | Chipping |
| Example 3-2 | 3.1 | 35.5 | 1 | 2200 | Normal wear | 900 | Chipping |
| Example 3-3 | 3.1 | 35.3 | 2 | 2100 | Normal wear | 800 | Chipping |
| Example 3-4 | 3.0 | 38 | 0 | 2200 | Normal wear | 900 | Chipping |
| Example 3-5 | 3.1 | 37.1 | 0 | 2200 | Normal wear | 900 | Chipping |

TABLE 25

Nb-containing thin film test results

| *Containing Nb Division | Thin film thickness (μm) | Thin film hardness (GPa) | Number of thermal cracks | Milling wear resistance (cm) | | Milling shock resistance (cm) |
|---|---|---|---|---|---|---|
| | | | | Cutting performance evaluation results | | |
| Comparative Example 4-1 | 3.1 | 36.8 | 7 | 1700 | Chipping | 200 |
| Comparative Example 4-2 | 3.0 | 36.5 | 8 | 1700 | Chipping | 300 |
| Comparative Example 4-3 | 3.0 | 34 | 8 | 1800 | Chipping | 300 |
| Comparative Example 4-4 | 3.0 | 33.5 | 7 | 1800 | Chipping | 280 |
| Comparative Example 4-5 | 3.1 | 37 | 8 | 2000 | Chipping | 250 |
| Comparative Example 4-6 | 2.9 | 36.1 | 8 | 1900 | Chipping | 250 |
| Comparative Example 4-7 | 3.0 | 33.2 | 9 | 1800 | Chipping | 250 |
| Comparative Example 4-8 | 3.2 | 30.5 | 8 | 1800 | Chipping | 200 |

TABLE 26

Ta-containing thin film test results

| *Containing Ta Division | Thin film thickness (μm) | Thin film hardness (GPa) | Number of thermal cracks | Milling wear resistance (cm) | | Milling shock resistance (cm) | |
|---|---|---|---|---|---|---|---|
| | | | | Cutting performance evaluation results | | | |
| Comparative Example 5-1 | 3.2 | 37 | 5 | 2300 | Normal wear | 450 | Chipping |

TABLE 26-continued

Ta-containing thin film test results

|  |  |  |  | Cutting performance evaluation results | | | |
| --- | --- | --- | --- | --- | --- | --- | --- |
| *Containing Ta Division | Thin film thickness (μm) | Thin film hardness (GPa) | Number of thermal cracks | Milling wear resistance (cm) | | Milling shock resistance (cm) | |
| Comparative Example 5-2 | 3.1 | 37.1 | 6 | 2300 | Chipping | 450 | Chipping |
| Comparative Example 5-3 | 3.1 | 37.2 | 7 | 1650 | Chipping | 450 | Chipping |
| Comparative Example 5-4 | 3.1 | 36.8 | 5 | 2000 | Chipping | 400 | Chipping |
| Comparative Example 5-6 | 3.0 | 36.1 | 6 | 2100 | Normal wear | 400 | Chipping |
| Comparative Example 5-7 | 3.2 | 36.5 | 5 | 1250 | Excessive wear | 100 | Initial delamination |
| Comparative Example 5-8 | 3.3 | 36.2 | 6 | 1000 | Excessive wear | 100 | Initial delamination |
| Example 5-1 | 3.0 | 37.5 | 1 | 2400 | Normal wear | 800 | Chipping |
| Example 5-2 | 3.0 | 37.6 | 0 | 2100 | Normal wear | 800 | Chipping |
| Example 5-3 | 3.1 | 37.8 | 0 | 2100 | Normal wear | 750 | Chipping |
| Example 5-4 | 3.0 | 41 | 0 | 2400 | Normal wear | 900 | Chipping |
| Example 5-5 | 3.1 | 37.2 | 0 | 2400 | Normal wear | 800 | Chipping |

TABLE 27

Cr-containing thin film test results

|  |  |  |  | Cutting performance evaluation results | | | |
| --- | --- | --- | --- | --- | --- | --- | --- |
| *Containing Cr Division | Thin film thickness (μm) | Thin film hardness (GPa) | Number of thermal cracks | Milling wear resistance (cm) | | Milling shock resistance (cm) | |
| Comparative Example 6-1 | 3.1 | 37.1 | 0 | 2100 | Normal wear | 600 | Chipping |
| Comparative Example 6-2 | 3.2 | 37.5 | 5 | 2100 | Normal wear | 600 | Chipping |
| Comparative Example 6-3 | 3.2 | 36.1 | 0 | 1200 | Excessive wear | 250 | Chipping |
| Comparative Example 6-4 | 3.3 | 35.5 | 0 | 800 | Excessive wear | 550 | Chipping |
| Comparative Example 6-5 | 3.3 | 37.1 | 4 | 1500 | Excessive wear | 500 | Chipping |
| Example 6-1 | 3.1 | 37 | 1 | 2200 | Normal wear | 900 | Chipping |
| Example 6-2 | 3.0 | 37.5 | 0 | 2200 | Normal wear | 900 | Chipping |
| Example 6-3 | 3.1 | 37 | 1 | 2100 | Normal wear | 850 | Chipping |
| Example 6-4 | 2.8 | 37.8 | 0 | 2300 | Normal wear | 900 | Chipping |
| Example 6-5 | 3.1 | 37.2 | 0 | 2300 | Normal wear | 900 | Chipping |

TABLE 28

Si-containing thin film test results

|  |  |  |  | Cutting performance evaluation results | | | |
| --- | --- | --- | --- | --- | --- | --- | --- |
| *Containing Si Division | Thin film thickness (μm) | Thin film hardness (GPa) | Number of thermal cracks | Milling wear resistance (cm) | | Milling shock resistance (cm) | |
| Comparative Example 7-1 | 3.0 | 48.9 | 1 | 280 | Chipping | 20 | Initial delamination |
| Example 7-1 | 3.0 | 40.5 | 0 | 2300 | Chipping | 750 | Chipping |
| Example 7-2 | 3.0 | 44 | 2 | 2400 | Chipping | 700 | Chipping |
| Example 7-3 | 3.1 | 45.8 | 2 | 2600 | Chipping | 700 | Chipping |

TABLE 28-continued

Si-containing thin film test results

| *Containing Si Division | Thin film thickness (μm) | Thin film hardness (GPa) | Number of thermal cracks | Cutting performance evaluation results | | | |
|---|---|---|---|---|---|---|---|
| | | | | Milling wear resistance (cm) | | Milling shock resistance (cm) | |
| Example 7-4 | 3.0 | 42 | 0 | 2500 | Chipping | 800 | Chipping |
| Example 7-5 | 2.8 | 44.9 | 0 | 2600 | Chipping | 700 | Chipping |

TABLE 29

V-and Si-containing thin film test results

| *Containing V + Si Division | Thin film thickness (μm) | Thin film hardness (GPa) | Number of thermal cracks | Cutting performance evaluation results | | | |
|---|---|---|---|---|---|---|---|
| | | | | Milling wear resistance (cm) | | Milling shock resistance (cm) | |
| Example 8-1 | 3.1 | 41.5 | 0 | 2500 | Normal wear | 800 | Chipping |
| Example 8-2 | 3.1 | 41 | 0 | 2500 | Normal wear | 850 | Chipping |

As shown in Table 22, in the case of comparative example 5 which does not include an AlTiZrN layer, it can be found that not only the hardness of a thin film is low, but also the number of thermal cracks is eight which is more than those in other examples or comparative examples. As a result, it may be found that physical properties are relatively worse than other hard coatings particularly in the aspect of milling wear resistance.

In addition, it may be found that although comparative examples 1-1 to 1-4, and 1-6 to 1-8 include AlTiZrN layers, the number of thermal cracks is great, milling shock resistance is extremely low, and thus, overall physical properties of the hard coatings are lower than examples 1-1 to 1-5 of the present invention.

Similarly, as shown in Table 23, in the case of examples 2-1 to 2-5 of the present invention comparative example 5 which includes an AlTiHfN layer, it can be found that the number of thermal cracks is smaller than comparative examples 2-1 to 2-4 and 2-6 to 2-8, or overall physical properties including milling wear resistance and milling shock resistance are remarkably improved.

This tendency similarly appears also in hard coatings containing V, Ta, Cr, Si, V or Si.

Meanwhile, as illustrated in Table 25, it may be found that when an AlTiNbN layer, containing Nb which does not have a thermal expansion coefficient between those of TiAlN and AlTiN, is used, not only the great number of thermal cracks but also both low milling wear resistance and low milling shock resistance are exhibited.

In addition, according to examples of the present invention, it may be found that hard coatings including an AlTiMeN layer including Zr, Ta, Si, V or Si exhibit higher physical properties, and thus, these components may be more favorably used.

That is, as confirmed through the examples and comparative examples, hard coatings according to the present invention may maintain high milling wear resistance and milling shock resistance while remarkably reducing thermal cracks, and thus may contribute to improve the service life of cutting tools.

The invention claimed is:

1. A hard coating formed on the surface of a base material for a cutting tool by a PVD method,
the hard coating comprising a thin film layer which has a total thickness of 0.5-10 μm and has an overall composition of $Al_{1-a-b}Ti_aMe_bN$ ($0.2<a\leq0.6$, $0<b\leq0.15$),
wherein the Me is a nitride constituent element having a thermal expansion coefficient of greater than $2.7\times10^{-6}/°$ C. and less than $9.35\times10^{-6}/°$ C.,
wherein the thin film layer has a nano-multilayered-structure of thin layers A, B and C, a thin layer B being disposed between a thin layer A and a thin layer C as a A-B-C layer or a C-B-A layer, the A-B-C layer or the C-B-A layer being repeatedly laminated at least once, wherein,
the thin layer A has a composition of $Ti_{1-a}Al_aN$ ($0.3\leq a<0.7$),
the thin layer B has a composition of $Ti_{1-y-z}Al_yMe_zN$ ($0.3\leq y<0.7$, $0.01\leq z<0.5$), and
the thin layer C has a composition of $Al_{1-x}Ti_xN$ ($0.3\leq x<0.7$),
wherein kA is the thermal expansion coefficient of the thin layer A, kB is the thermal expansion coefficient of the thin layer B, and kC is the thermal expansion coefficient of the thin layer C, the thin film layer satisfying the relationship of kA>kB>kC,
wherein the difference in the thermal expansion coefficients of Me nitrides and the thermal expansion coefficients of the AlN and TiN is at least $1.0\times10^{-6}/°$ C.

2. The hard coating of claim 1, wherein the Me comprises one or more selected from among Si and Groups 4a, 5a, and 6a elements.

3. The hard coating of claim 1, wherein the Me comprises one or more selected from among Si, Zr, Hf, V, Ta, and Cr.

* * * * *